(12) United States Patent
Ma et al.

(10) Patent No.: US 10,026,412 B2
(45) Date of Patent: Jul. 17, 2018

(54) METHOD AND DEVICE FOR PULSE ENCODING, METHOD AND DEVICE FOR PULSE DECODING

(71) Applicant: HUAWEI TECHNOLOGIES CO., LTD., Shenzhen, Guangdong (CN)

(72) Inventors: Fuwei Ma, Shenzhen (CN); Dejun Zhang, Beijing (CN); Minjie Xie, Shenzhen (CN); Qing Zhang, Munich (DE)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/151,508

(22) Filed: May 11, 2016

(65) Prior Publication Data

US 2016/0329059 A1    Nov. 10, 2016

Related U.S. Application Data

(63) Continuation of application No. 14/252,382, filed on Apr. 14, 2014, now Pat. No. 9,349,381, which is a (Continued)

(30) Foreign Application Priority Data

Jun. 19, 2009    (CN) .......................... 2009 1 0150637

(51) Int. Cl.
*G10L 19/10*    (2013.01)
*G10L 19/12*    (2013.01)
(Continued)

(52) U.S. Cl.
CPC .......... *G10L 19/113* (2013.01); *G10L 19/002* (2013.01); *G10L 19/04* (2013.01);
(Continued)

(58) Field of Classification Search
CPC .......... G10L 19/04; G10L 25/90; G10L 19/24; G10L 19/002; G10L 13/02; G10L 19/20;
(Continued)

(56) References Cited

U.S. PATENT DOCUMENTS 4,464,650 A    8/1984 Eastman et al.
4,631,521 A    12/1986 El-Sherbini
(Continued)

FOREIGN PATENT DOCUMENTS

CN    1890713 A    1/2007
CN    101295506 A    10/2008
(Continued)

OTHER PUBLICATIONS

D Lee, E. "Iteration-free pulse replacement method for algebraic codebook search." Electronics Letters 43.1 (2007): 59-60.*
(Continued)

*Primary Examiner* — Matthew H Baker
(74) *Attorney, Agent, or Firm* — Huawei Technologies Co., Ltd.

(57) ABSTRACT

The present application discloses a pulse encoding method for use by a voice encoder. An initial number of coding bits is determined according to number of pulses in an input signal. An index value is calculated according to information of the pulses in the input signal. The index value is compared with an adjustment threshold value. If the index value is smaller than the adjustment threshold value, the index value is encoded using a reduced number of encoding bits. If the index value is not smaller than the adjustment threshold value, the index value plus an offset value is encoded using the initial number of encoding bits. The reduced number of encoding bits is smaller than the initial number of encoding bits, and the offset value is greater than or equal to the adjustment threshold value.

6 Claims, 3 Drawing Sheets

Related U.S. Application Data continuation of application No. 13/325,993, filed on Dec. 14, 2011, now Pat. No. 9,723,700, which is a continuation of application No. PCT/CN2010/073651, filed on Jun. 8, 2010.

(51) Int. Cl.

| | | |
|---|---|---|
| *G10L 19/113* | (2013.01) | |
| *H03M 7/30* | (2006.01) | |
| *H03M 7/40* | (2006.01) | |
| *G10L 19/002* | (2013.01) | |
| *G10L 19/04* | (2013.01) | |
| *G10L 19/00* | (2013.01) | |

(52) U.S. Cl.
CPC .............. *H03M 7/30* (2013.01); *H03M 7/40* (2013.01); *H03M 7/4068* (2013.01); *G10L 19/10* (2013.01); *G10L 19/12* (2013.01); *G10L 2019/0016* (2013.01)

(58) Field of Classification Search
CPC ... G10L 19/12; G10L 2025/935; G10L 19/02; G10L 2025/783; G10L 19/012; G10L 19/038; G10L 19/09; G10L 19/107; G10L 19/01

See application file for complete search history.

(56) References Cited

U.S. PATENT DOCUMENTS

| | | | |
|---|---|---|---|
| 4,906,995 A | 3/1990 | Swanson | |
| 5,627,533 A | 5/1997 | Clark | |
| 5,701,392 A * | 12/1997 | Adoul | G10L 19/12 704/200.1 |
| 5,754,976 A * | 5/1998 | Adoul | G10L 19/12 704/219 |
| 5,898,301 A | 4/1999 | La Croix et al. | |
| 6,101,061 A | 8/2000 | Goker | |
| 6,236,960 B1 | 5/2001 | Peng et al. | |
| 6,295,520 B1 * | 9/2001 | Tian | G10L 19/10 704/219 |
| 6,300,884 B1 | 10/2001 | Wilson | |
| 6,507,814 B1 * | 1/2003 | Gao | G10L 19/005 704/219 |
| 6,823,303 B1 * | 11/2004 | Su | G10L 19/005 704/201 |
| 6,847,929 B2 * | 1/2005 | Bernard | G10L 19/10 704/219 |
| 6,967,993 B1 | 11/2005 | Miller | |
| 7,496,504 B2 | 2/2009 | Lee et al. | |
| 7,574,354 B2 | 8/2009 | Lamblin et al. | |
| 7,596,491 B1 * | 9/2009 | Stachurski | G10L 19/24 704/203 |
| 7,684,644 B2 | 3/2010 | Stefanov et al. | |
| 8,280,729 B2 | 10/2012 | Yu et al. | |
| 8,294,602 B2 | 10/2012 | Ma et al. | |
| 8,301,440 B2 | 10/2012 | Zopf et al. | |
| 8,502,709 B2 | 8/2013 | Jia | |
| 8,527,265 B2 | 9/2013 | Reznik et al. | |
| 9,230,553 B2 * | 1/2016 | Morii | G10L 19/10 |
| 2002/0072903 A1 | 6/2002 | Kurihara et al. | |
| 2004/0064310 A1 | 4/2004 | Banba et al. | |
| 2004/0193410 A1 * | 9/2004 | Lee | G10L 19/032 704/219 |
| 2005/0177364 A1 * | 8/2005 | Jelinek | G10L 19/24 704/214 |
| 2005/0267746 A1 | 12/2005 | Jelinek et al. | |
| 2006/0290539 A1 | 12/2006 | Tomic | |
| 2007/0067164 A1 * | 3/2007 | Goudar | G10L 19/107 704/219 |
| 2007/0124138 A1 | 5/2007 | Lamblin et al. | |
| 2008/0215317 A1 | 9/2008 | Fejzo | |
| 2008/0319740 A1 * | 12/2008 | Su | G10L 19/09 704/225 |
| 2009/0043572 A1 | 2/2009 | Teo et al. | |
| 2009/0234644 A1 | 9/2009 | Reznik et al. | |
| 2009/0240491 A1 | 9/2009 | Reznik et al. | |
| 2009/0259922 A1 | 10/2009 | Garudadri et al. | |
| 2010/0088091 A1 * | 4/2010 | Lee | G10L 19/12 704/219 |
| 2010/0235173 A1 * | 9/2010 | Zhang | G10L 19/10 704/500 |
| 2010/0280831 A1 | 11/2010 | Salami et al. | |
| 2011/0026581 A1 | 2/2011 | Ojala et al. | |
| 2011/0184733 A1 | 7/2011 | Yu et al. | |

FOREIGN PATENT DOCUMENTS

| | | |
|---|---|---|
| CN | 101388210 A | 3/2009 |
| EP | 1221694 A1 | 7/2002 |
| JP | 10209877 A | 8/1998 |
| WO | 0120595 A1 | 3/2001 |
| WO | 2008151755 A1 | 12/2008 |

OTHER PUBLICATIONS

3GPP TS 26.190 version 8.0.0 Release 8.*
Truncated binary encoding; Wikipedia, the free encyclopedia; Oct. 3, 2008; XP002673473; Retrieved from the Internet: URL:http://en.wikipedia.org/w/index.php?title=Truncated_binary_encoding &oldid=242631969; total 1 pages.
Phase-in Codes; WordPress.com; Sep. 2, 2008; XP002673474; Retrieved from the Internet: URL:http://hbfs.wordpress.com/2008/09/02/phase-in-codes/; total 4 pages.
Makoto Hiroi; File Compression due to LZ77 Algorithm for Improving Compression Ratios by Using a Range Coder, and Improvement thereof, First Part, Interface vol. 32, No. 6, Japan, CQ Publishing Co., Ltd., Jun. 1, 2006, vol. 32 (in particular, refer to "Coding Distances with CBT Code"); with an English translation total 11 pages.
Udar Mittal et al: "Coding unconstrained FCB excitation using combinatortal and huffman codes", 2012 IEEE, total 3 pages.
Andy C. Hung et al: "Error resilient pyramid vector quantization for image compression", IEEE Transactions on Image Processing, vol. 7, No. 10, Oct. 1998, total 14 pages.

* cited by examiner

METHOD AND DEVICE FOR PULSE ENCODING, METHOD AND DEVICE FOR PULSE DECODING

CROSS-REFERENCE TO RELATED APPLICATIONS

This application is a continuation of U.S. application Ser. No. 14/252,382, filed on Apr. 14, 2014, which is a continuation of U.S. application Ser. No. 13/325,993, filed on Dec. 14, 2011, now U.S. Pat. No. 8,723,700. U.S. application Ser. No. 13/325,993 is a continuation of International Application No. PCT/CN2010/073651, filed on Jun. 8, 2010. International Application No. PCT/CN2010/073651 claims priority to Chinese Patent Application No. 200910150637.8, filed on Jun. 19, 2009. The afore-mentioned patent applications are hereby incorporated by reference in their entirety.

TECHNICAL FIELD

The present invention relates to encoding and decoding technologies, and in particular, to a method and a device for pulse encoding, and a method and a device for pulse decoding.

BACKGROUND

In the field of voice encoding, a voice encoder based on a Code Excited Linear Prediction (CELP) encoding model is the most widely used. Compared with voice encoders of other types, the voice encoder can obtain good voice quality in the case of a very low bit rate, and its performance is still outstanding in the case of a high bit rate. In the CELP model, as simulation of an excitation signal, an adaptive codebook and a fixed codebook play a very important role. The role of an adaptive filter is to remove long-term correlation from a voice residual signal. After the long-term correlation from the voice residual signal is removed, the voice residual signal becomes similar to a white noise. Therefore, it is difficult to effectively quantize a target signal of the fixed codebook. Currently, a method to deal with the fixed codebook is to replace the fixed codebook with an algebraic codebook.

In a voice encoder, location and symbol information about all pulses on each track is obtained through an algebraic codebook search. To effectively transmit the location and symbol information about all pulses on each track to a decoder end, the location and symbol information about these pulses must be processed properly. The processing must ensure that no location or symbol information about any pulse is lost, that is to say, the decoder end can uniquely recover the location and symbol information about all pulses. Meanwhile, to reduce the bit rate as much as possible, the processing method must ensure that the location and symbol information about the pulses are encoded by using minimum bits. The number of bits used to encode the location and symbol information about all pulses on each track in a theoretical case may be obtained through collecting statistics about permutations and combinations of all pulse locations on the same track. The number of bits used to encode the number of permutations and combinations of all pulse locations on the same track is a theoretical lower limit. When categorizing and orderly encoding the number of permutations and combinations of all pulse locations on the same track, the required number of bits may reach the theoretical lower limit if the theoretical lower limit is an integer, and may be equal to the integral part of the theoretical lower limit plus one if the theoretical lower limit is a decimal.

Assume that n pulses exist on a same track, location and symbol information about the n pulses are respectively obtained through an algebraic codebook search algorithm, and multiple pulses may exist on a same location on the same track. In this case, if the multiple pulses on the same location are encoded respectively, a lot of pulses were wasted. From the perspective of permutations and combinations, a $p_0$ and a $p_1$ on the same location and a $p_1$ and a $p_0$ on the same location belong to the same case. Therefore, to save bits as much as possible and avoid encoding a same case multiple times, collect statistics about locations with a pulse (regarding a location with multiple pulses as one pulse location), output information about pulse locations, information about the number of pulses, and information about corresponding pulse symbols, and take the pulse locations into consideration in terms of category. If n pulses exist on a same track, the number of pulse locations may be categorized through collecting statistics about the pulse locations. Assume that the number of pulse locations is m. It may be predicted that the value range of m is $1 \leq m \leq n$. For each specific value of m, calculate the number of permutations and combinations of a pulse statistical function (assuming that the total number of permutations and combinations is W), divide data within a specific range into w segments, and the corresponding number of permutations and combinations W is related to the total number of pulses on a track.

For the convenience of encoding the foregoing categories in an orderly manner, the foregoing categories are effectively combined here. An existing combination method is described as follows: 1. Calculate the number of all the foregoing permutations and combinations, calculate the ultimately required number of bits BIT, and divide the bit stream into several segments. Each segment represents a category. 2. Categories are classified according to the value of m. Generally, the number of categories is n. A first category indicates that n pulse locations persist after pulse locations are combined; a second category indicates that n−1 pulse locations persist after pulse locations are combined; the rest may be deduced by analogy. An $n^{th}$ category indicates that one pulse location persists after pulse locations are combined. Each category exists only in a closed range, such as [0x100000, 0x17FFFF]. 3. For a certain category, several bits (the number of bits is determined by the total number of permutations and combinations of pulse location functions) are taken out to represent a sub-category.

After the categorization processing according to the foregoing three steps, sequence the categories. The categories are sequenced in many ways, and are sequenced according to the number of pulse locations in descending order here. Finally, put each category in a different segment to finally form an ultimate index value. After receiving the ultimate index value, the decoder end performs decoding according to the foregoing sequencing order of each category, sub-category, and the number of combinations to obtain the location and symbol information about each pulse. That is, the entire encoding and decoding process is completed.

In the research of the prior art, the inventor finds that: Although the integral value of the theoretical number of bits can be used for encoding by adopting the foregoing technical solution, in the case that the number of pulses on each track is fixed, the number of bits used for any pulse combination is fixed. For example, 6 pulses exist on a track, and the theoretical value of encoding bits is 20.5637. Therefore, 21 bits need to be used for encoding. 21 bits can indicate a range from 0 to $2^{21}-1$, while the index of 6 pulses ranges from 0 to 1549823. 547328 numerical values exist from 1549824 to $2^{21}-1$. Therefore, about 26.1% space is wasted, and therefore, encoding bits are wasted, which results in low encoding efficiency.

SUMMARY

Embodiments of the present invention provide a method and a device for pulse encoding, and a method and a device for pulse decoding, which can save encoding bits and improve encoding efficiency.

An embodiment of the present invention provides a method for pulse encoding, where the method includes:

calculating an index value of an input pulse;

selecting an adjustment threshold value according to the number of pulses, and comparing the index value of the pulse with the adjustment threshold value; and if the index value is smaller than the adjustment threshold value, adopting the first number of encoding bits to encode the index value, if the index value is not smaller than the adjustment threshold value, adopting the second number of encoding bits to encode the index value plus an offset value, where the first number is smaller than the second number, the first number and the second number are both positive integers, and the offset value is greater than or equal to the adjustment threshold value.

An embodiment of the present invention further provides a method for pulse decoding, where the method includes:

demultiplexing an encoding code stream and extracting the first number of encoding bits from the demultiplexed encoding code stream;

if a decoded value of the first number of encoding bits is smaller than an adjustment threshold value, outputting the decoded value of the first number of encoding bits; and if the decoded value of the first number of encoding bits is greater than or equal to the adjustment threshold value, decoding the second number of encoding bits, where the second number of encoding bits is extracted from the code stream, and outputting a decoded value of the second number of encoding bits, where the first number is smaller than the second number, and the first number and the second number are both positive integers.

An embodiment of the present invention further provides a device for pulse encoding, where the device includes:

a calculating unit, configured to calculate an index value of an input pulse;

a selection unit, configured to select an adjustment threshold value according to the number of pulses; and an encoding unit, configured to adopt the first number of encoding bits to encode the index value if the index value calculated and obtained by the calculating unit is smaller than the adjustment threshold value selected by the selection unit, and adopt the second number of encoding bits to encode the index value plus an offset value if the index value calculated and obtained by the calculating unit is greater than or equal to the adjustment threshold value selected by the selection unit, where the first number is smaller than the second number, the first number and the second number are both positive integers, and the offset value is greater than or equal to the adjustment threshold value.

An embodiment of the present invention further provides a device for pulse decoding, where the device includes:

an extraction unit, configured to demultiplex an encoding code stream and extract the first number of encoding bits from the demultiplexed encoding code stream;

a decoding unit, configured to decode the first number of encoding bits extracted by the extraction unit, and decode the second number of encoding bits, where the second number of encoding bits is extracted from the code stream, if a decoded value of the first number of encoding bits is greater than or equal to the adjustment threshold value; and an output unit, configured to output the decoded value of the first number of encoding bits if the decoded value of the first number of encoding bits decoded and obtained by the decoding unit is smaller than the adjustment threshold value, and output a decoded value of the second number of encoding bits if the decoded value of the first number of encoding bits decoded and obtained by the decoding unit is not smaller the adjustment threshold value, where the first number is smaller than the second number, and the first number and the second number are both positive integers.

It can be seen from the foregoing technical solutions provided in the embodiments of the present invention that, according to the embodiments of the present invention, the first number of encoding bits may be used to encode the index value if the index value is smaller than the adjustment threshold value. That is, the second number of encoding bits does not need to be used to encode the index value smaller than the adjustment threshold value. In this way, the encoding bits are saved, and the encoding efficiency is improved.

BRIEF DESCRIPTION OF THE DRAWINGS

To illustrate the technical solutions according to the embodiments of the present invention or in the prior art more clearly, accompanying drawings needed for describing the embodiments or the prior art are briefly introduced below. Apparently, the accompanying drawings in the following description are only some embodiments of the present invention and persons of ordinary skill in the art may also obtained other drawings according to the accompanying drawings without creative efforts.

DETAILED DESCRIPTION

The technical solutions in the embodiments of the present invention are clearly and fully described in the following with reference to the accompanying drawings in the embodiments of the present invention. Obviously, the embodiments to be described are only part of rather than all of the embodiments of the present invention. All other embodiments obtained by persons of ordinary skill in the art based on the embodiments of the present invention without creative efforts shall fall within the protection scope of the present invention.

Figure 1:
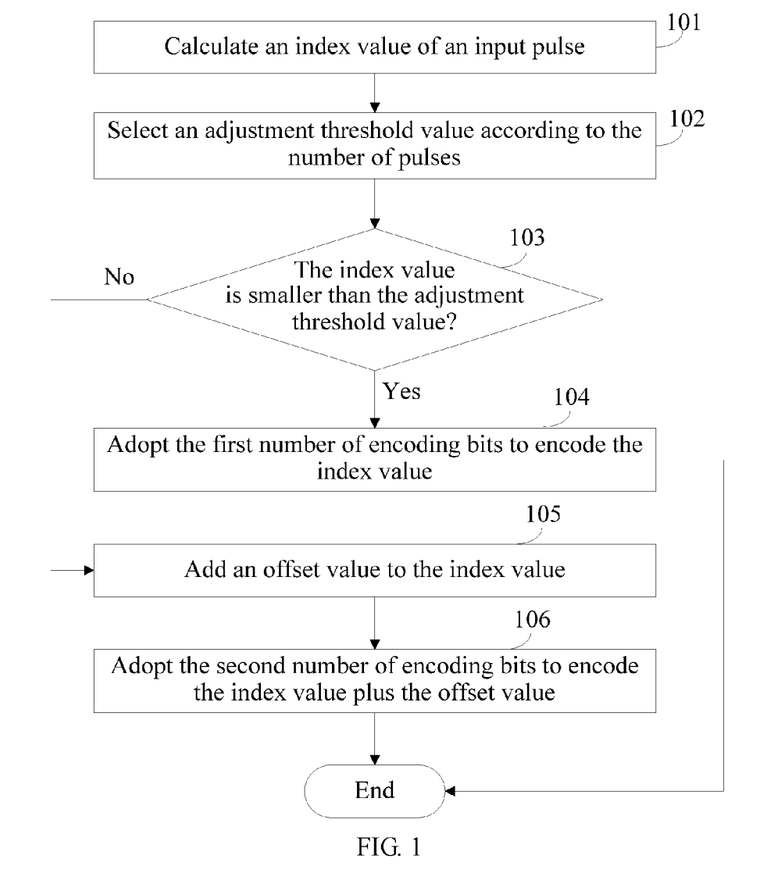
FIG. 1 is a flow chart of an embodiment of a method for pulse encoding according to an embodiment of the present invention.

A method for pulse encoding provided in an embodiment of the present invention is described first. FIG. 1 describes a process of an embodiment of the method for pulse encoding, where the method includes:

101: Calculate an index value of an input pulse.

The input pulse is a pulse possessed by an input signal. The number of pulses on a track and a location and symbol of each pulse may be obtained by searching the input signal.

Specifically, after the number of pulses is determined, a codebook space where a corresponding index value is located is determined. Then, the index value may be determined according to the location where each pulse is located and the symbol of each pulse.

102: Select an adjustment threshold value according to the number of pulses.

After the number of pulses is determined, the codebook space where the corresponding index value is located is determined. Accordingly, the number of encoding bits required to encode the codebook space is also determined. For example, when 6 pulses exist on a track, 21 encoding bits are required to encode a codebook space corresponding to an index value of the 6 pulses. However, the codebook space corresponding to the index value of the 6 pulses does not occupy all the encoding space corresponding to the 21 encoding bits. That is, a certain remaining space exists. In an embodiment of the present invention, the adjustment threshold value is smaller than or equal to the number of numerical values in the remaining space. Therefore, the adjustment threshold values corresponding to the various numbers of pulses may be preset.

The set number of adjustment threshold values may be one or at least two. If the number of adjustment threshold values is one, the adjustment threshold value may be directly selected. If the number of adjustment threshold values is at least two, one may be selected from the at least two adjustment threshold values.

In an embodiment of the present invention, the number of preset adjustment threshold values is at least two, and the number of adjustment threshold values selected according to the number of pulses is at least two. Therefore, before 103, the method may further include: comparing the index value with the at least two adjustment threshold values; if the index value is smaller than a minimum adjustment threshold value of the at least two adjustment threshold values, selecting the minimum adjustment threshold value; if the index value is greater than a maximum adjustment threshold value of the at least two adjustment threshold values, selecting the maximum adjustment threshold value; if the index value is within a range formed by two adjacent adjustment threshold values of the at least two adjustment threshold values, selecting the smaller adjustment threshold value of the two adjacent adjustment threshold values.

For example, in an embodiment of the present invention, the number of adjustment threshold values is one, and the adjustment threshold value set for 6 pulses on a track is 547328.

Specifically, the selection of an adjustment threshold value may be determined by combining an occurrence probability and the number of bits that may be saved. In a codebook space, the smaller the selected adjustment threshold value is, the more bits are saved, the lower the probability that bits can be saved.

103: Judge whether the index value is smaller than the adjustment threshold value; if the index value is smaller than the adjustment threshold value, the process proceeds to 104; if the index value is not smaller than the adjustment threshold value, the process proceeds to 105.

Specifically, compare the index value with the adjustment threshold value to judge whether the index value is smaller than the adjustment threshold value.

104: Adopt the first number of encoding bits to encode the index value; the entire process is completed.

The first number is a positive integer.

105: Add an offset value to the index value.

In an embodiment of the present invention, the offset value is greater than or equal to the adjustment threshold value.

106: Adopt the second number of encoding bits to encode the index value plus the offset value; the entire process is completed.

The second number is also a positive integer, where the second number is greater than the first number.

In an embodiment of the present invention, the second number may be a value obtained by rounding up a theoretical value of the encoding bits required to encode all pulses on a track. For example, when 6 pulses exist on a track, 20.5637 encoding bits are required theoretically for encoding. Round up 20.5637 to obtain 21. That is, the second number may be 21. In an embodiment of the present invention, the relationship between the second number and the theoretical value of encoding bits required to encode the various number of pulses on a track is as shown in Table 1.

TABLE 1

| Number of Pulses on a Same Track | Theoretical Value of Encoding Bits | Second Number |
| --- | --- | --- |
| 1 | 5 | 5 |
| 2 | 9 | 9 |
| 3 | 12.4179 | 13 |
| 4 | 15.4263 | 16 |
| 5 | 18.2110 | 19 |
| 6 | 20.5637 | 21 |

Certainly, obtaining the second number by rounding up the theoretical value of encoding bits required to encode all pulses on a track is only an embodiment of the present invention, the second number may be greater than or smaller than the value obtained by rounding up the theoretical value. The value of the second number is not limited to the embodiments of the present invention.

It can be seen from the foregoing that, the embodiment may use the number of encoding bits smaller than the second number to encode the index value if the index value is smaller than the adjustment threshold value. That is, the second number of encoding bits does not need to be used to encode the index value smaller than the adjustment threshold value. In this way, the encoding bits are saved, and the encoding efficiency is improved.

Take an example that 6 pulses exist on a track to describe a second embodiment of the method for pulse encoding provided in an embodiment of the present invention. The number of encoding bits required to encode 6 pulses on a track is 21, that is, 21 bits. 21 bits can indicate a range from 0 to $2^{21}-1$, and an index of 6 pulses ranges from 0 to 1549823. Therefore, a remaining space including 547328 numerical values exist within the range from 1549824 to $2^{21}-1$.

Calculate an index value index, and then compare the index with an adjustment threshold value THR. In this embodiment, only one THR is set and the THR may be 547328.

If the index is smaller than 547328, directly use the first number of encoding bits to encode the index. In this embodiment, the first number is 20.

If the index is greater than or equal to 547328, add 547328 to the index, and use the second number of encoding bits to encode the index plus 547328. In this embodiment, the second number is 21.

Specifically, when the index<THR, index=index, indicating that index∈[0, THR−1], and 20 encoding bits are required to encode the index.

When 547328≤index≤1549823, index=index+547328, indicating that index∈[2*THR,$2^{21}-1$], and 21 encoding bits are required to encode the new index. Moreover, the most significant 20 bits of the index does not overlap with [0, THR−1] because index/2∈[THR,$2^{20}-1$]. Therefore, the uniqueness of coding after the index value is encoded may be ensured.

In another embodiment of the present invention, only one THR is set, and the THR may be 547325. If the index is smaller than 547325, directly use the first number of encoding bits to encode the index. In this embodiment, the first number is 20. If the index is greater than or equal to 547325, add an offset value to the index, and use the second number of encoding bits to encode the index plus the offset value, where the range of the offset value is [547325,547328]. In this embodiment, the second number is 21.

Figure 2:
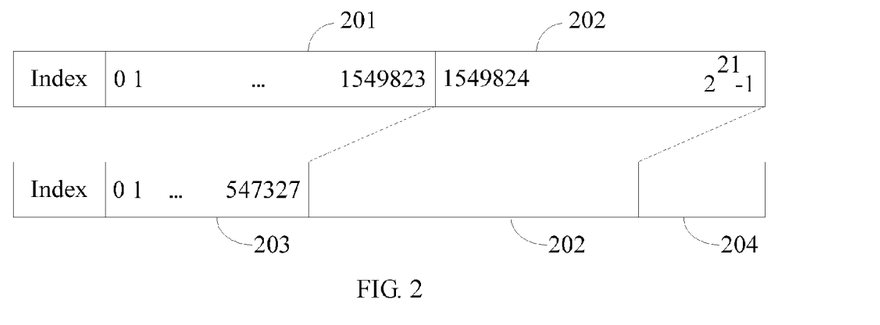
FIG. 2 is a schematic diagram of index encoding according to an embodiment of the present invention.

FIG. 2 is a schematic diagram of index encoding, where 6 pulses exist on a track and the adjustment threshold value is 547328.

21 bits are required to encode 6 pulses on a track. 21 bits may indicate a range of [0, $2^{21}-1$], the range of a codebook space 201 corresponding to the index for encoding the 6 pulses is [0, 1549823], and the range of a remaining space 202 is [1549824, $2^{21}-1$]. The adjustment threshold value is 547328. Therefore, after the remaining space 202 is inserted after 547327, the codebook space 201 is divided into two parts, that is, 203 and 204, where the range of 203 is [0, 547327]. The original range of 204 is [547328, 1549823]. However, after the remaining space 202 is inserted, 204 reaches the end of the range of 21 bits, and the corresponding range becomes [1094656, $2^{21}-1$]. At this time, 20 bits may be used to encode the index values within the corresponding range of 203, and 21 bits may be used to encode the index values within the original range of 204 plus 547328.

In the method for pulse encoding provided in the embodiment of the present invention, the adjustment threshold value may be set within the codebook space where the index value is located, and then the remaining space is inserted after the adjustment threshold value. The remaining space is a remaining part of the value space corresponding to the number of encoding bits obtained by rounding up the theoretical value of encoding bits required to encode all pulses on a track minus the codebook space.

If the number of adjustment threshold values is at least two, the steps for inserting the remaining space after the adjustment threshold values may specifically include: dividing the remaining space into sub-remaining spaces, where the number of sub-remaining spaces is smaller than or equal to the number of the adjustment threshold values; and inserting the sub-remaining spaces respectively after the adjustment threshold values, where the number of the adjustment threshold values is the same as the number of the sub-remaining spaces.

In an embodiment of the present invention, the remaining space may be divided into sub-remaining spaces, where the number of the sub-remaining spaces is the same as the number of the adjustment threshold values. In another embodiment of the present invention, the remaining space may be divided into sub-remaining spaces on average. That is, the size of each sub-remaining space is the same.

Figure 3:
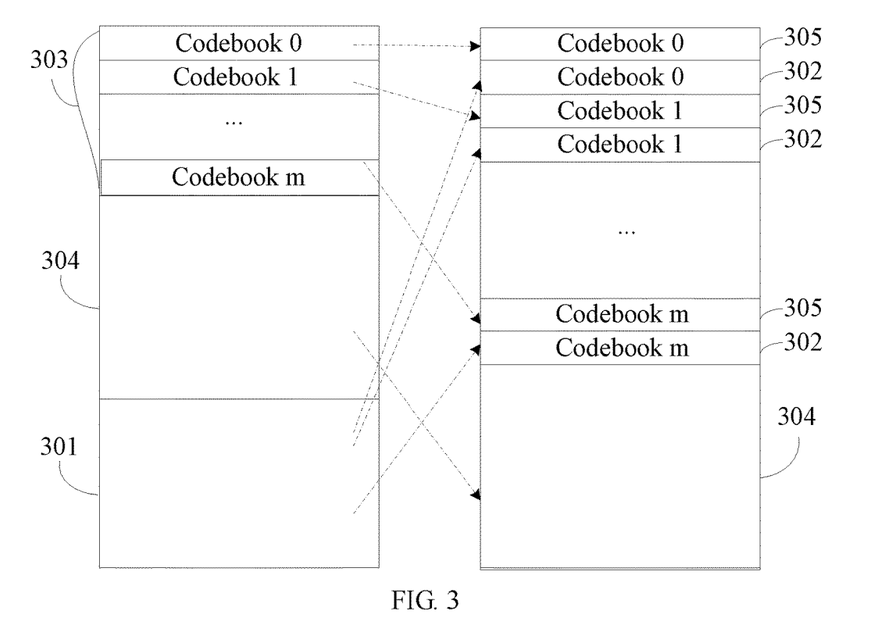
FIG. 3 is a schematic diagram of a remaining space adjustment according to an embodiment of the present invention.

FIG. 3 is a schematic diagram of a remaining space adjustment, and describes how a remaining space is adjusted according to an embodiment of the present invention. A part 301 is a remaining codebook space, and a part 303 and a part 304 is a used codebook space. m−1 adjustment thresholds are set for the part 303. Therefore, the part 303 is divided into m codebooks 305. Specifically, first divide the remaining codebook space 301 into m sub-remaining spaces 302 on average, and then insert a sub-remaining codebook space 302 between every two adjacent codebooks 305. In this embodiment, the adjustment threshold value may be set as a start value of the used codebook space 304.

An index value of a pulse indicates a location and symbol of the pulse on a track. Therefore, writing the index value of the pulse into a multiplexed encoding code stream at an encoder end is writing the location and symbol of the pulse on the track into the encoding code stream. In this way, after demultiplexing the encoding code stream, the decoder end may obtain the index value of the pulse, thus the location and symbol of the pulse on the track are obtained.

Figure 4:
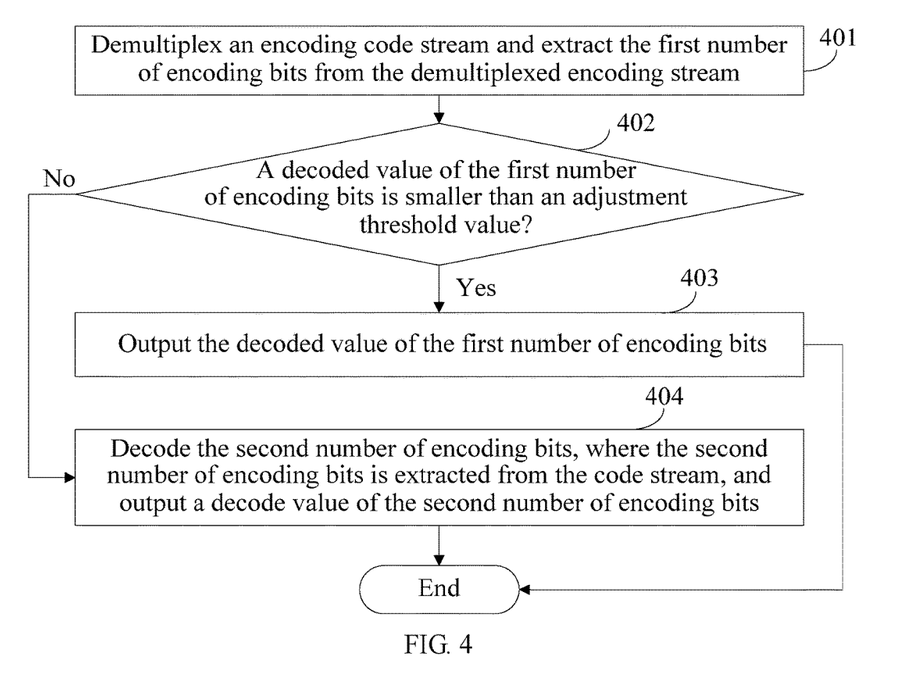
FIG. 4 is a flow chart of an embodiment of a method for pulse decoding according to an embodiment of the present invention.

A method for pulse decoding provided in an embodiment of the present invention is described in the following. FIG. 4 describes a process of the method for pulse decoding, where the method includes:

401: Demultiplex an encoding code stream and extract the first number of encoding bits from the demultiplexed encoding code stream.

The first number is a positive integer. Specifically, extract the first number of encoding bits from a location where an index value should be stored from the demultiplexed encoding code stream; when the first number of encoding bits is adopted at an encoder end to encode the index value, the index value may be decoded and obtained by using the extracted first number of encoding bits; when the number of encoding bits greater than the first number are adopted at the encoder end to encode the index value, only part of the index value can be decoded and obtained by using the extracted first number of encoding bits.

A decoder end does not know whether the first number of encoding bits or the second number of encoding bits are adopted to encode the index value at the encoder end. The index value corresponding to the first number of encoding bits is definitely smaller than an adjustment threshold value. Therefore, assume that the first number of encoding bits is adopted at the encoder end to encode the index value, extract the first number of encoding bits from the location where the index value is located from the encoding code stream, and decode the first number of encoding bits.

402: Judge whether a decoded value of the first number of encoding bits is smaller than the adjustment threshold value; if the decoded value of the first number of encoding bits is smaller than the adjustment threshold value, the process proceeds to 403; if the decoded value of the first number of encoding bits is not smaller than the adjustment threshold value, the process proceeds to 404.

403: Output the decoded value of the first number of encoding bits; the process is completed.

When the decoded value of the first number of encoding bits is smaller than the adjustment threshold value, it indicates that the first number of encoding bits is adopted at the encoder end to encode the index value of the pulse. Therefore, the decoded value of the first number of encoding bits is the index value.

404: Decode the second number of encoding bits, where the second number of encoding bits is extracted from the code stream, and output a decode value of the second number of encoding bits; the process is completed.

If the decoded value of the first number of encoding bits is greater than or equal to the adjustment threshold value, it indicates that the second number of encoding bits is adopted at the encoder end to encode the index value. Therefore, decode the second number of encoding bits, where the second number of encoding bits is extracted from the code stream, and output the decoded value of the second number of encoding bits. The decoded value of the second number of encoding bits is the index value.

The second number is a positive integer, where the second number is greater than the first number.

In an embodiment of the present invention, the step of decoding the second number of encoding bits, where the second number of the encoding bits is extracted from the code stream, may specifically include: extracting the second number of encoding bits from the code stream for decoding. That is, including the first number of encoding bits, where the first number of encoding bits is extracted in step 401, the first number and the second number of encoding bits are extracted totally. In another embodiment of the present invention, the step of decoding the second number of encoding bits, where the second number of the encoding bits is extracted from the code stream, may specifically include: extracting encoding bits from the code stream, where a sum of the number of the encoding bits and the first number is equal to the second number, that is, including the first number of encoding bits, where the first number of encoding bits is extracted in step 401, only the second number of encoding bits needs to be extracted totally, and the decoding speed is increased; obtaining an intermediate value by adding a reference value to the decoded value of the first number of encoding bits and then adding the decoded value of the encoding bits; obtaining the decoded value of the second number of encoding bits by subtracting an offset value from the intermediate value. The offset value is greater than or equal to the adjustment threshold value.

The reference value is corresponding to the extracted number of encoding bits. Assume that the reference value is a, the decoded value of the first number of encoding bits is b, and the extracted number of encoding bits is c, then $a=b(2^c-1)$.

It can be seen from the foregoing that, according to this embodiment, the first number of encoding bits may be decoded, so that the encoder end may use the first number of encoding bits to encode the index value when the index value is smaller than the adjustment threshold value. That is, the second number of encoding bits does not need to be used to encode the index value smaller than the adjustment threshold value at the encoder end. In this way, the encoding bits are saved, and the encoding efficiency is improved.

Figure 5:
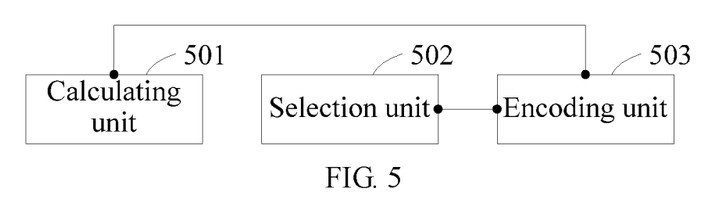
FIG. 5 is a structural diagram of a first embodiment of a device for pulse encoding according to an embodiment of the present invention.

A device for pulse encoding provided in an embodiment of the present invention is described in the following. FIG. 5 describes a structure of a first embodiment of the device for pulse encoding, where the device includes:

a calculating unit 501, configured to calculate an index value of an input pulse;

a selection unit 502, configured to select an adjustment threshold value according to the number of pulses; and an encoding unit 503, configured to adopt the first number of encoding bits to encode the index value if the index value calculated and obtained by the calculating unit 501 is smaller than the adjustment threshold value selected by the selection unit 502, and adopt the second number of encoding bits to encode the index value plus an offset value if the index value calculated and obtained by the calculating unit 501 is greater than or equal to the adjustment threshold value selected by the selection unit 502, where the first number is smaller than the second number, the first number and the second number are both positive integers, and the offset value is greater than or equal to the adjustment threshold value.

It can be seen from the foregoing that, the device for pulse encoding according to this embodiment may use the first number of encoding bits to encode the index value if the index value is smaller than the adjustment threshold value. That is, the second number of encoding bits does not need to be used to encode the index value smaller than the adjustment threshold value. In this way, the encoding bits are saved, and the encoding efficiency is improved.

Figure 6:
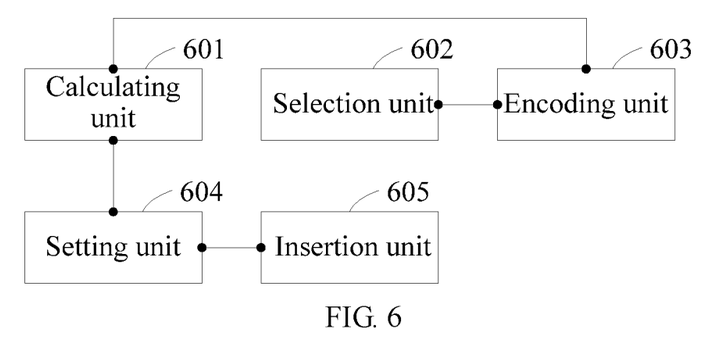
FIG. 6 is a structural diagram of a second embodiment of the device for pulse encoding according to an embodiment of the present invention.

FIG. 6 describes a structure of a second embodiment of the device for pulse encoding provided in an embodiment of the present invention, where the device includes:

a calculating unit 601, configured to calculate an index value of an input pulse;

a selection unit 602, configured to select an adjustment threshold value according to the number of pulses;

an encoding unit 603, configured to adopt the first number of encoding bits to encode the index value if the index value calculated and obtained by the calculating unit 601 is smaller than the adjustment threshold value selected by the selection unit 602, and adopt the second number of encoding bits to encode the index value plus an offset value if the index value calculated and obtained by the calculating unit 601 is greater than or equal to the adjustment threshold value selected by the selection unit 602, where the first number is smaller than the second number, the first number and the second number are both positive integers, and the offset value is greater than or equal to the adjustment threshold value;

a setting unit 604, configured to set an adjustment threshold within a codebook space where the index value calculated and obtained by the calculating unit 601 is located; and an insertion unit 605, configured to insert a remaining space after the adjustment threshold set by the setting unit 604, where the remaining space is a remaining part of a value space corresponding to the number of encoding bits obtained by rounding up a theoretical value of encoding bits required to encode all pulses on a track minus a codebook space.

In an embodiment of the present invention, the insertion unit 605 may include: a dividing unit 6051, configured to divide the remaining space into sub-remaining spaces, where the number of sub-remaining spaces is smaller than or equal to the number of adjustment threshold values; and a space insertion unit 6052, configured to respectively insert the sub-remaining spaces after the adjustment thresholds, where the number of the adjustment thresholds is the same as the number of the sub-remaining spaces.

It can be seen from the foregoing that, the device for pulse encoding according to this embodiment may use the first number of encoding bits to encode the index value if the index value is smaller than the adjustment threshold value. That is, the second number of encoding bits does not need to be used to encode the index value smaller than the adjustment threshold value. In this way, the encoding bits are saved, and the encoding efficiency is improved.

Figure 7:
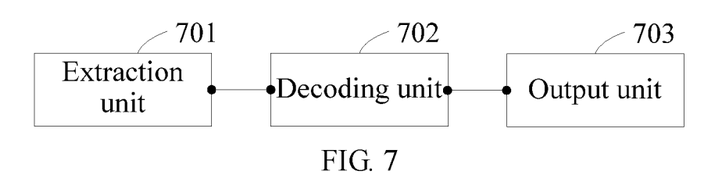
FIG. 7 is a structural diagram of a first embodiment of a device for pulse decoding according to an embodiment of the present invention.

A device for pulse decoding provided in an embodiment of the present invention is introduced below. FIG. 7 describes a structure of a first embodiment of the device for pulse decoding, where the device includes:

an extraction unit 701, configured to demultiplex an encoding code stream and extract the first number of encoding bits from the demultiplexed encoding code stream;

a decoding unit 702, configured to decode the first number of encoding bits, where the first number of encoding bits is extracted by the extraction unit 701, and if a decoded value of the first number of encoding bits is greater than or equal to an adjustment threshold value, decode the second number of encoding bits, where the second number of encoding bits is extracted from the code stream; and an output unit 703, configured to output the decoded value of the first number of encoding bits if the decoded value of the first number of encoding bits, where the first number of encoding bits is decoded by the decoding unit 702, is smaller than the adjustment threshold value, and output a decoded value of the second number of encoding bits if the decoded value of the first number of encoding bits, where the first number of encoding bits is decoded by the decoding unit 702, is not smaller than the adjustment threshold value, where the first number is smaller than the second number, and the first number and the second number are both positive integers.

It can be seen from the foregoing that, the device for pulse decoding according to this embodiment may decode the first number of encoding bits, so that the encoder end may use the first number of encoding bits to encode the index value if the index value is smaller than the adjustment threshold value. That is, the second number of encoding bits does not need to be used to encode the index value smaller than the adjustment threshold value at the encoder end. In this way, the encoding bits are saved, and the encoding efficiency is improved.

Figure 8:
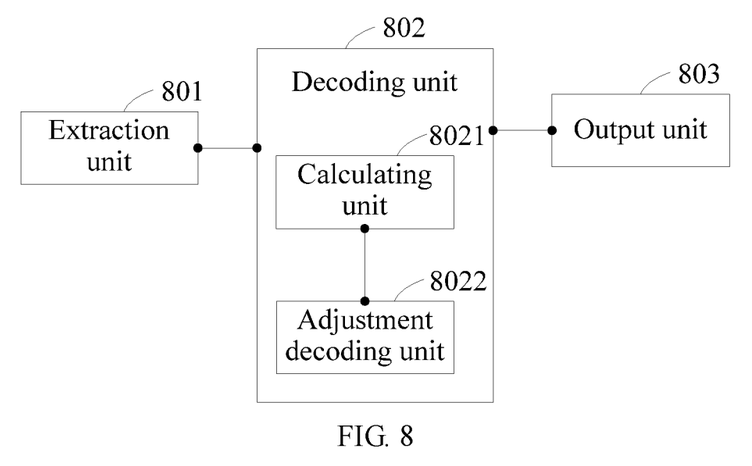
FIG. 8 is a structural diagram of a second embodiment of the device for pulse decoding according to an embodiment of the present invention.

FIG. 8 describes a structure of a second embodiment of the device for pulse decoding, where the device includes:

an extraction unit 801, configured to extract the first number of encoding bits from an encoding code stream; if a decoded value of the first number of encoding bits is greater than or equal to an adjustment threshold value, extract encoding bits from the code stream, where a sum of the number of the encoding bits and the first number is equal to a second number; the first number is smaller than the second number, and the first number and the second number are both positive integers; and a decoding unit 802, configured to decode the first number of encoding bits, where the first number of encoding bits is extracted by the extraction unit 801, and if the decoded value of the first number of encoding bits is greater than or equal to the adjustment threshold value, decode the second number of encoding bits, where the second number of encoding bits is extracted from the code stream.

In an embodiment of the present invention, the decoding unit 802 may include: a calculating unit 8021, configured to obtain an intermediate value by adding a reference value to the decoded value of the first number of encoding bits and then adding the decoded value of the extracted encoding bits; and an adjustment decoding unit 8022, configured to obtain a decoded value of the second number of encoding bits by subtracting an offset value from the intermediate value calculated by the calculating unit 8021, where the offset value is greater than or equal to the adjustment threshold value.

An output unit 803 is configured to output the decoded value of the first number of encoding bits if the decoded value of the first number of encoding bits decoded by the decoding unit 802 is smaller than the adjustment threshold value, and output the decoded value of the second number of encoding bits if the decoded value of the first number of encoding bits decoded by the decoding unit 802 is not smaller than the adjustment threshold value.

It can be seen from the foregoing that, the device for pulse decoding according to this embodiment may decode the first number of encoding bits, so that an encoder end may use the first number of encoding bits to encode the index value if the index value is smaller than the adjustment threshold value. That is, the second number of encoding bits does not need to be used to encode the index value smaller than the adjustment threshold value at the encoder end. In this way, the encoding bits are saved, and the encoding efficiency is improved.

To assess the performance of the embodiments of the present invention, the inventor collects statistics about the probabilities of different pulse locations if 6 pulses exist on a track, and the result as shown in Table 2 is obtained. During the statistics, the adjustment threshold value is 547328.

TABLE 2

| Number of Pulse Locations | Start Value of Encoding | Occurrence Probability | Encoding Range | Originally Required Number of Bits | Number of Bits Required by the Present Invention |
|---|---|---|---|---|---|
| 6 | 0x00000 | 56.3961% | [0, HR-1] | 21 bit | 20 bit |
| 5 | 0x07d200 | 36.4399% | [THR, $2^{21}$-1] | 21 bit | 21 bit |
| 4 | 0x127c00 | 6.1064% | | | |
| 3 | 0x16ed80 | 0.7577% | | | |
| 2 | 0x179c80 | 0.1216% | | | |
| 1 | 0x17a5e0 | 0.1783% | | | |

It can be seen from Table 2 that the probability of 6 different pulse locations on a track is the highest, and the probability of 5 different pulses locations on a track is the second highest. Moreover, in all the cases of 6 pulse locations and some cases of 5 pulse locations, only 20 encoding bits are required for encoding, which saves 1 bit compared with the 21 encoding bits required by the prior art. It can be seen from Table 2 that, in the mode of 6 pulses on a track, 1 bit can be saved in approximately over 60% cases.

The inventor also collects statistics about the cases in which 1 to 6 pulses exist on a track, and the statistical result is as shown in Table 3.

TABLE 3

| Number of Pulses on a Same Track | Number of Required Encoding Bits | | |
|---|---|---|---|
| | Theoretical Value | Prior art | Present Invention |
| 1 | 5 | 5 | 5 |
| 2 | 9 | 9 | 9 |
| 3 | 12.4179 | 13 | 12 or 13 |
| 4 | 15.4263 | 16 | 15 or 16 |
| 5 | 18.1210 | 19 | 18 or 19 |
| 6 | 20.5637 | 21 | 20 or 21 |

It can be seen from Table 3 that, according to the embodiments of the present invention, in some cases of 3, 4, 5, or 6 pulses on a track, one encoding bit can be saved, and therefore, the purpose of improving the encoding efficiency is achieved.

Persons of ordinary skill in the art may understand that all or part of the steps of the method according to the foregoing embodiments may be implemented by a program instructing relevant hardware. The program may be stored in a computer readable storage medium. When the program is executed, the steps of each method according to the foregoing embodiments may be performed. The storage medium may be a magnetic disk, an optical disk, a Read-Only Memory (ROM), or a Random Access Memory (RAM).

The method and device for pulse encoding and the method and device for pulse decoding provided in the embodiments of the present invention are described in detail above. The description about the preceding embodiments is merely provided for ease of understanding of the method and ideas of the present invention. Persons of ordinary skill in the art may make variations and modifications to the present invention in terms of the specific implementations and application scopes according to the ideas of the present invention. Therefore, the specification shall not be construed as limitations to the present invention.

The invention claimed is:

1. A audio signal encoding method, comprising:
   with an audio signal encoder,
      receiving an input audio signal;
      extracting information of pulses on a track of the audio signal, wherein the information of the pulses comprises: number of the pulses, positions of the pulses on the track, and symbols of the pulses;
      determining an index value corresponding to the information of the pulses;
      determining an initial number of bits for encoding the index value;
      comparing the index value with an adjustment threshold value;
      when the index value is smaller than the adjustment threshold value, encoding the index value using a reduced number of bits, or
      when the index value is not smaller than the adjustment threshold value, encoding the index value plus an offset value using the initial number of bits; and
      transmitting the encoded index value to a decoding side,
      wherein the reduced number of bits is smaller than the initial number of bits, and the initial number of bits and the reduced number of bits are both positive integers,
      and wherein the offset value is greater than or equal to the adjustment threshold value.

2. The audio signal encoding method according to claim 1, wherein the initial number of bits is obtained by rounding up a theoretical value of bits required to encode the index value.

3. The audio signal encoding method according to claim 2, further comprising:
   determining a value range corresponding to the initial number of bits;
   determining a codebook space corresponding to the number of the pulses and a value range of the codebook space, wherein the value range of the codebook space is smaller than the value range corresponding to the initial number of bits; and
   setting the adjustment threshold value as smaller than or equal to a difference between the value range corresponding to the initial number of bits and the value range of the codebook space.

4. A non-transitory computer readable medium having computer executable program codes stored thereon for use by an audio signal encoder, wherein the program codes comprise instructions for:
   receiving an input audio signal;
   extracting information of pulses on a track of the audio signal, wherein the information of the pulses comprises: number of the pulses, positions of the pulses on the track, and symbols of the pulses;
   determining an index value corresponding to the information of the pulses;
   determining an initial number of bits for encoding the index value;
   comparing the index value with an adjustment threshold value;
   when the index value is smaller than the adjustment threshold value, encoding the index value using a reduced number of bits, or
   when the index value is not smaller than the adjustment threshold value, encoding the index value plus an offset value using the initial number of bits; and
   transmitting the encoded index value to a decoding side,
   wherein the reduced number of bits is smaller than the initial number of bits, and the initial number of bits and the reduced number of bits are both positive integers,
   and wherein the offset value is greater than or equal to the adjustment threshold value.

5. The non-transitory computer readable medium according to claim 4, wherein the initial number of bits is obtained by rounding up a theoretical value of bits required to encode the index value.

6. The non-transitory computer readable medium according to claim 5, wherein the program codes further comprise instructions for:
   determining a value range corresponding to the initial number of bits;
   determining a codebook space corresponding to the number of the pulses and a value range of the codebook space, wherein the value range of the codebook space is smaller than the value range corresponding to the initial number of bits; and
   setting the adjustment threshold value as smaller than or equal to a difference between the value range corresponding to the initial number of bits and the value range of the codebook space.

* * * * *

UNITED STATES PATENT AND TRADEMARK OFFICE
CERTIFICATE OF CORRECTION

PATENT NO. : 10,026,412 B2
APPLICATION NO. : 15/151508
DATED : July 17, 2018
INVENTOR(S) : Fuwei Ma et al.

Page 1 of 1

It is certified that error appears in the above-identified patent and that said Letters Patent is hereby corrected as shown below:

On the Title Page

Item (63), Related U.S. Application Data, is corrected as below:
Related U.S. Application Data
(63) Continuation of application No. 14/252,382, filed on Apr. 14, 2014, now Pat. No. 9,349,381, which is a continuation of application No. 13/325,993, filed on Dec. 14, 2011, now Pat. No. 8,723,700, which is a continuation of application No. PCT/CN2010/073651, filed on Jun. 8, 2010.

Signed and Sealed this
Fifth Day of February, 2019

Andrei Iancu
*Director of the United States Patent and Trademark Office*